(12) United States Patent
Park et al.

(10) Patent No.: US 10,785,557 B2
(45) Date of Patent: *Sep. 22, 2020

(54) MEMS MICROPHONE AND METHOD OF MANUFACTURING THE SAME

(71) Applicant: DONGBU HITEK CO., LTD., Seoul (KR)

(72) Inventors: Dong Chun Park, Incheon (KR); Han Choon Lee, Seoul (KR)

(73) Assignee: DB HITEK CO., LTD., Seoul (KR)

( * ) Notice: Subject to any disclaimer, the term of this patent is extended or adjusted under 35 U.S.C. 154(b) by 191 days.

This patent is subject to a terminal disclaimer.

(21) Appl. No.: 15/620,946

(22) Filed: Jun. 13, 2017

(65) Prior Publication Data

US 2017/0359648 A1    Dec. 14, 2017

(30) Foreign Application Priority Data

Jun. 13, 2016    (KR) .................. 10-2016-0073123

(51) Int. Cl.
*H04R 1/28* (2006.01)
*B81B 3/00* (2006.01)
(Continued)

(52) U.S. Cl.
CPC ......... *H04R 1/2807* (2013.01); *B81B 3/0021* (2013.01); *B81C 1/00015* (2013.01);
(Continued)

(58) Field of Classification Search
USPC .............................. 381/175; 257/416; 438/53
See application file for complete search history.

(56) References Cited

U.S. PATENT DOCUMENTS

| | | | | |
|---|---|---|---|---|
| 5,189,777 A | * | 3/1993 | Guckel | G01L 9/0042 29/424 |
| 7,932,117 B2 | * | 4/2011 | Ueya | H04R 19/04 438/53 |

(Continued)

FOREIGN PATENT DOCUMENTS

| | | |
|---|---|---|
| KR | 10-2010-0073051 | 7/2010 |
| KR | 10-1462375 | 11/2014 |
| KR | 10-1578542 | 12/2015 |

OTHER PUBLICATIONS

KR 101578542 B2. English Translation. (Year: 2015).*
(Continued)

*Primary Examiner* — Phylesha Dabney
(74) *Attorney, Agent, or Firm* — Patterson Thuente Pedersen, P.A.

(57) ABSTRACT

A MEMS microphone includes a substrate having a cavity, a back plate disposed over the substrate to cover the cavity and having a plurality of acoustic holes, a diaphragm disposed over the substrate to cover the cavity, the diaphragm being disposed under the back plate, including a venting hole communicating with the cavity, and sensing an acoustic pressure to create a displacement, and a first insulation layer interposed between the substrate and the diaphragm to support an end portion of the diaphragm to separate the diaphragm from the substrate, and the first insulation layer having an opening formed at a position corresponding to the cavity to expose the diaphragm. Thus, since the process of forming an anchor may be omitted, the process may be simplified, and process time may be shortened.

23 Claims, 6 Drawing Sheets

(51) Int. Cl.
   *B81C 1/00* (2006.01)
   *H04R 19/00* (2006.01)
   *H04R 19/04* (2006.01)
   *H04R 31/00* (2006.01)

(52) U.S. Cl.
   CPC ............ *H04R 19/005* (2013.01); *H04R 19/04* (2013.01); *H04R 31/006* (2013.01); *B81B 2201/0257* (2013.01)

(56) References Cited

U.S. PATENT DOCUMENTS

| | | | | |
|---|---|---|---|---|
| 8,541,852 B2* | 9/2013 | Kasai | ............... | H04R 19/005 257/416 |
| 8,942,394 B2* | 1/2015 | Conti | ............... | H04R 7/24 381/175 |
| 10,158,949 B2 | 12/2018 | Sun et al. | | |
| 10,158,952 B2 | 12/2018 | Sun et al. | | |
| 10,412,504 B2* | 9/2019 | Sun | ............... | B81C 1/00182 |
| 2004/0106221 A1* | 6/2004 | Hunter | ............... | B81C 1/00246 438/21 |
| 2006/0050905 A1* | 3/2006 | Ohbayashi | ............... | H04R 19/005 381/175 |
| 2006/0145570 A1* | 7/2006 | Ohbayashi | ............... | H04R 19/005 310/322 |
| 2006/0233400 A1* | 10/2006 | Ohbayashi | ............... | H04R 19/016 381/175 |
| 2006/0233401 A1 | 10/2006 | Wang | | |
| 2007/0249079 A1* | 10/2007 | Sasagawa | ............... | B81B 3/0008 438/48 |
| 2011/0127650 A1* | 6/2011 | Witvrouw | ............... | B81C 1/00333 257/622 |
| 2012/0139065 A1* | 6/2012 | van Beek | ............... | B81B 3/001 257/415 |
| 2012/0229709 A1* | 9/2012 | Heald | ............... | B81C 1/00269 348/739 |
| 2012/0235969 A1* | 9/2012 | Burns | ............... | B81C 1/00095 345/211 |
| 2016/0362292 A1 | 12/2016 | Chang et al. | | |
| 2017/0311083 A1 | 10/2017 | Sun et al. | | |
| 2017/0311088 A1 | 10/2017 | Sun et al. | | |
| 2017/0311089 A1 | 10/2017 | Sun et al. | | |

OTHER PUBLICATIONS

U.S. Appl. No. 15/497,374, filed Apr. 26, 2017, Inventor(s): Sun et al.
U.S. Appl. No. 15/497,366, filed Apr. 26, 2017, Inventor(s): Sun et al.
U.S. Appl. No. 15/497,358, filed Apr. 26, 2017, Inventor(s): Sun et al.
Korean Office Action, Korean Application No. 10-2016-0050894, dated Feb. 22, 2018, 3 pages (7 pages with translation).
Korean Office Action, Korean Application No. 10-2016-0050894, dated Jun. 26, 2018, 4 pages (7 pages with translation).

* cited by examiner

MEMS MICROPHONE AND METHOD OF MANUFACTURING THE SAME

CROSS-REFERENCE TO RELATED APPLICATION

This application claims priority to Korean Patent Application No. 10-2016-0073123, filed on Jun. 13, 2016 and all the benefits accruing therefrom under 35 U.S.C. § 119, the contents of which are incorporated by reference in their entirety.

TECHNICAL FIELD

The present disclosure relates to MEMS microphones capable of converting a sound wave into an electrical signal, and a method of manufacturing such MEMS microphones. More particularly, embodiments described herein relate to capacitive MEMS microphones capable of sensing an acoustic pressure to create a displacement corresponding to an acoustic signal at a distance.

BACKGROUND

Generally, a capacitive microphone utilizes a capacitance between a pair of electrodes facing each other to transmit an acoustic signal. The capacitive microphone can be manufactured by a semiconductor MEMS process to have an ultra-small size.

A MEMS microphone includes a bendable diaphragm and a back plate facing the diaphragm. The diaphragm is disposed apart from a substrate and the back plate to freely bend upward or downward in response to sound waves incident upon the diaphragm. The diaphragm can be a membrane structure to perceive an acoustic pressure to create a displacement. In other words, when the acoustic pressure arrives at the diaphragm, the diaphragm may be bent toward the back plate due to the acoustic pressure. The displacement of the diaphragm can be sensed through a change of capacitance formed between the diaphragm and the back plate. As a result, sound can be converted into an electrical signal for output.

Since MEMS microphones are manufactured through a plurality of etching processes for patterning each of several thin layers each using a mask, a manufacturing process for manufacturing MEMS microphones is complex, and lots of masks are required in the manufacturing process. In conventional manufacturing methods, the MEMS microphone has an anchor for supporting the diaphragm apart from the substrate, and a chamber for forming a spacing area between the diaphragm and the back plate. The anchor is formed through separate masks and etching processes. This increases the number of masks required for the manufacturing process of the MEMS microphone, which may cause increases in production costs and processing time.

SUMMARY

The example embodiments of the present invention provides a MEMS microphone for achieve a simplification of a process by decreasing a number of masks required for the process for the MEMS microphone.

The example embodiments of the present invention provides a method of manufacturing a MEMS microphone using a decreased number of masks required for the process for the MEMS microphone.

According to an example embodiment of the present invention, a MEMS microphone includes a substrate having a cavity, a back plate disposed over the substrate to cover the cavity and having a plurality of acoustic holes, a diaphragm disposed over the substrate to cover the cavity, the diaphragm being disposed under the back plate, including a venting hole communicating with the cavity, and sensing an acoustic pressure to create a displacement, and a first insulation layer interposed between the substrate and the diaphragm to support an end portion of the diaphragm to separate the diaphragm from the substrate, and the first insulation layer having an opening formed at a position corresponding to the cavity to expose the diaphragm.

In an example embodiment, the venting hole may be formed on portions of the diaphragm corresponding to the cavity.

In an example embodiment, the opening may be greater than the cavity.

In an example embodiment, the MEMS microphone may further include a second insulating layer formed over the substrate on which the back plate is formed, to cover the back plate, and the second insulation layer including a chamber bent toward the substrate outside of the back plate to separate the back plate from the diaphragm, and the chamber may make contact with an upper surface of the substrate.

In an example embodiment, the back plate may have a plurality of dimple holes on a portion corresponding to the cavity, and the second insulation layer may have a plurality of dimples protruded toward the substrate on portions on which the dimple holes are formed, and the acoustic holes may be formed to penetrate through the second insulation layer and the back plate.

In an example embodiment, the dimples may protrude under the back plate through the dimple holes.

In an example embodiment, the chamber may be provided on a portion corresponding to a peripheral portion of the cavity, and surrounds the diaphragm and the back plate.

In an example embodiment, the MEMS microphone may further include a diaphragm pad formed on an upper surface of the first insulation layer to be connected to the diaphragm, an insulation interlayer formed on the first insulation layer on which the diaphragm is formed, and positioned outside of the chamber under the second insulation layer, a back plate pad formed on an upper surface of the insulation interlayer to be connected to the back plate, a first pad electrode disposed on the second insulation layer and over the diaphragm pad to be electrically connected to the diaphragm pad, and a second pad electrode disposed on the second insulation layer over the back plate to be electrically connected to the back plate pad.

According to an example embodiment of the present invention, a MEMS microphone may include a substrate divided into a vibration area and a peripheral area surrounding the vibration area, the substrate having a cavity formed in the vibration area, a first insulation layer disposed on the substrate, and having an opening formed by removing a portion corresponding to the cavity, a back plate disposed over the first insulation layer and in the vibration area, and the back plate having a plurality of acoustic holes, and a diaphragm formed to cover the cavity, the diaphragm being spaced apart from the back plate to be disposed under the back plate, including a venting hole communicating with the cavity, and sensing an acoustic pressure to create a displacement.

In an example embodiment, the MEMS microphone may further include a second insulation layer formed on the substrate on which the back plate is formed, to cover the back plate, and the second insulation layer including a chamber bent toward the substrate in the peripheral area to separate the back plate from the diaphragm, and the chamber may make contact with an upper surface of the substrate.

In an example embodiment, the back plate may have a plurality of dimple holes, and the second insulation layer may have a plurality of dimples protruded toward the substrate through the dimple holes greater than a bottom surface of the back plate, and the acoustic holes may be formed through the second insulation layer and the back plate.

In an example embodiment, the chamber may surround the vibration area.

In an example embodiment, the MEMS microphone may further include a diaphragm pad formed on an upper surface of the first insulation layer in the peripheral are, and the diaphragm being electrically connected to the diaphragm, an insulation interlayer formed on the first insulation layer in the peripheral area, and positioned under the second insulation layer, a back plate pad formed on an upper surface of the insulation interlayer to be electrically connected to the back plate, a first pad electrode formed on the second insulation layer in the peripheral area, to be electrically connected to the diaphragm pad, and a second pad electrode formed on the second insulation layer in the peripheral area, to be electrically connected to the back plate pad.

According to an example embodiment of the present invention of a method of manufacturing a MEMS microphone, a first silicon layer is deposited on a first insulation layer formed on an upper surface of a substrate. The first silicon layer is patterned to form a diaphragm having a venting hole. A sacrificial layer and a second silicon layer are sequentially deposited on the first insulation layer on which the diaphragm is formed. The second silicon layer is patterned to form a back plate facing the diaphragm, and the back plate having a plurality of acoustic holes. The substrate is patterned to form a cavity partially exposing the first insulation layer under the diaphragm. An exposed portion of the first insulation layer is removed through an etching process using the cavity to form an opening which exposes the diaphragm. The sacrificial layer located between the diaphragm and the back plate is removed through an etching process using the cavity and the acoustic holes.

In an example embodiment, after forming the back plate, further the method may further include patterning the sacrificial layer and the first insulation layer to form a chamber contact hole for forming a chamber supporting the back plate, depositing a second insulation layer having the chamber on the sacrificial layer on which the back plate is formed, and patterning the second insulation layer and the back plate to form the acoustic holes penetrating through the second insulation layer and the back plate. The substrate may be partially exposed through the chamber contact hole, and the chamber may be formed in the chamber contact hole to make contact with the substrate.

In an example embodiment, the method may further include forming the back plate includes patterning the second silicon layer to form a plurality of dimple holes penetrating through the back plate and removing a portion of the sacrificial layer exposed through the dimple holes. The second insulation layer may be deposited by filling the dimple holes to form a plurality of dimples.

In an example embodiment, the diaphragm may be formed by patterning the first silicon layer to form a diaphragm pad connected to the diaphragm. The back plate may be formed by patterning the second silicon layer to form a back plate pad electrically connected to the back plate. The chamber contact hole may be formed by patterning the sacrificial layer to expose the diaphragm pad and to form an insulation interlayer disposed outside of the chamber contact hole.

In addition, in an example embodiment, after depositing the second insulation layer, the method may further include patterning the second insulation layer to form a first pad contact hole exposing the diaphragm pad and a second pad contact hole exposing the back plate pad, and forming a first pad electrode and a second pad electrode on the second insulation layer, the first pad electrode making contact with the diaphragm pad through the first pad contact hole, the second pad electrode making contact with the back plate pad through the second pad contact hole.

In an example embodiment, the chamber contact hole may be formed to surround the diaphragm, and the dimple holes and the acoustic holes may be formed on portions of the back plate corresponding to the cavity. The sacrificial layer may be removed by serving the cavity, the opening, the vent hole, and the acoustic holes as flow paths of the etching fluid for removing the sacrificial layer.

In an example embodiment, the first insulation layer and the sacrificial layer may include the same material, and forming the opening and removing the sacrificial layer may be simultaneously performed by an etching process using hydrogen fluoride (HF) vapor as etching fluid.

According to an example embodiment of the present invention of a method of manufacturing a MEMS microphone, a first silicon layer is deposited on a first insulation layer formed on an upper surface of a substrate. The first silicon layer is patterned through an etching process using a diaphragm pattern mask to form a diaphragm having a venting hole. A sacrificial layer and a second silicon layer are sequentially deposited on the first insulation layer on which the diaphragm is formed. The second silicon layer is patterned through an etching process using a back plate pattern mask to form a back plate in a vibration area. The substrate is patterned through an etching process using a cavity pattern mask to form a cavity partially exposing the first insulation layer in the vibration area. An exposed portion of the first insulation layer, which is exposed though the cavity, is removed through an etching process using the cavity to form an opening to expose the diaphragm, and sequentially removing the sacrificial layer in the vibration area using the opening.

In an example embodiment, after forming the back plate, the method may further include patterning the sacrificial layer and the first insulation layer through an etching process using a chamber pattern mask to form a chamber contact hole for forming a chamber supporting the back plate in a peripheral area surrounding the vibration area, depositing a second insulation layer having the chamber on the sacrificial layer on which the back plate is formed, and patterning the second insulation layer and the back plate through an etching process using an acoustic hole pattern mask to form a plurality of acoustic holes penetrating through the back plate and the pad insulation layer. The chamber may be formed in the chamber contact hole to make contact with the substrate, and the venting hole and the acoustic holes may serve as flow paths of the etching fluid for removing the sacrificial layer.

In an example embodiment, forming the back plate may include forming a plurality of dimple holes penetrating through the back plate through an etching process using the back plate pattern mask and removing a portion of the sacrificial layer exposed through the dimple holes, and depositing the insulation interlayer may include forming a plurality of dimples by filling the dimple holes.

In an example embodiment, forming the diaphragm may include patterning the first silicon layer through an etching process using the diaphragm pattern mask to form a diaphragm pad connected to the diaphragm in the peripheral area, and forming the back plate may include patterning the second silicon layer through an etching process using the back plate pattern mask to form a back plate pad connected to the back plate in the peripheral area, and forming the chamber contact hole may include patterning the sacrificial layer through an etching process using the chamber pattern mask to expose the diaphragm pad and to form an insulation interlayer in the peripheral area, and after depositing the second insulation layer, the method may further include patterning the second insulation layer through an etching process using a contact hole pattern mask to form a first pad contact hole exposing the diaphragm pad and a second pad contact hole exposing the back plate pad, depositing an electrode layer on the second insulation layer on which the first and second pad contact holes are formed, and patterning the electrode layer through an etching process using the electrode pattern mask to form a first pad electrode making contact with the diaphragm pad through the first contact hole and a second pad electrode making contact with the back plate through the second contact hole.

According to example embodiments of the present invention as described above, the first insulation layer can support the diaphragm, and thus, the MEMS microphone does not need to have an additional anchor for supporting the diaphragm. Accordingly, masks and steps for forming the anchor in the process for manufacturing the MEMS microphone can be omitted, so that the process can be simplified, and the process time can be shortened.

In addition, since a mask for forming the anchor and a mask for implanting ions of the diaphragm are not required in the MEMS microphone, the number of masks required to manufacture the MEMS microphone compared with a conventional MEMS microphone and the manufacturing cost can be reduced.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

Figure 1:
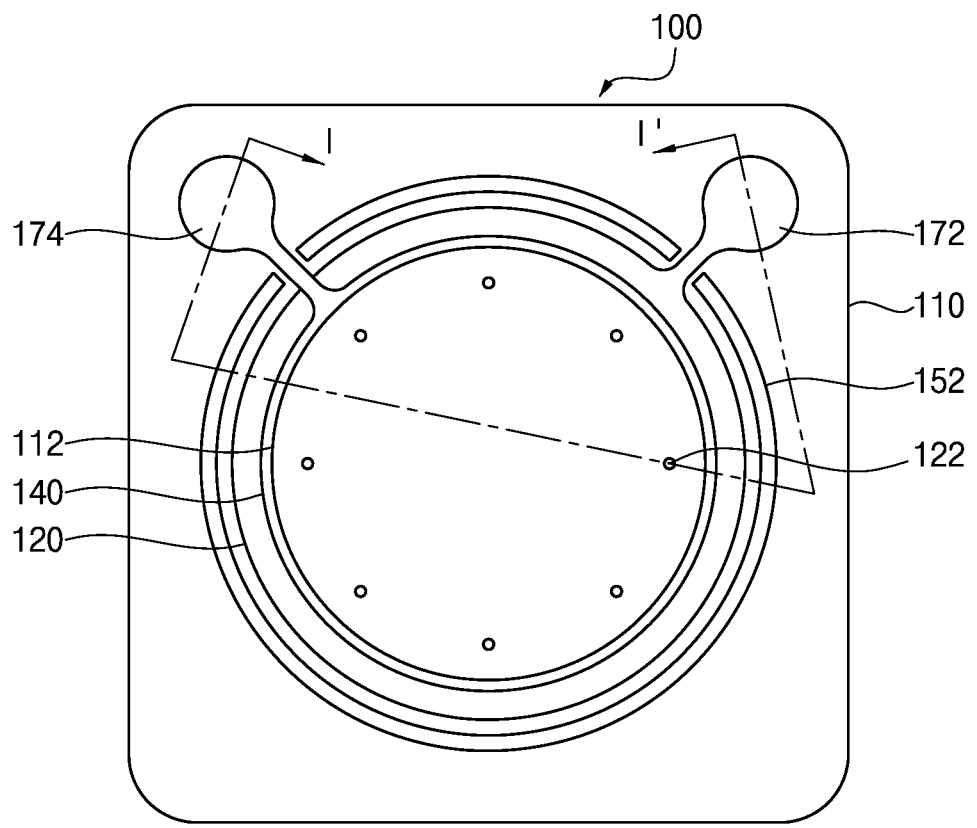
FIG. 1 is a plan view illustrating a MEMS microphone in accordance with an example embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a layer, a region or a plate is referred to as being 'on' another one, it can be directly on the other one, or one or more intervening layers, regions, or plates may also be present. By contrast, it will also be understood that when a layer, a film, a region or a plate is referred to as being 'directly on' another one, it is directly on the other one, and one or more intervening layers, films, regions, or plates do not exist. Also, although terms such as a first, a second, and a third are used to describe various components, compositions, regions, films, and layers in various embodiments of the present invention, such elements are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are sufficiently expected. The Figures are not necessarily drawn to scale. Accordingly, embodiments of the present invention are not described as being limited to specific shapes of areas described with diagrams and include deviations in the shapes and also the areas described with drawings are entirely schematic and their shapes do not represent accurate shapes and also do not limit the scope of the present invention.

Figure 2:
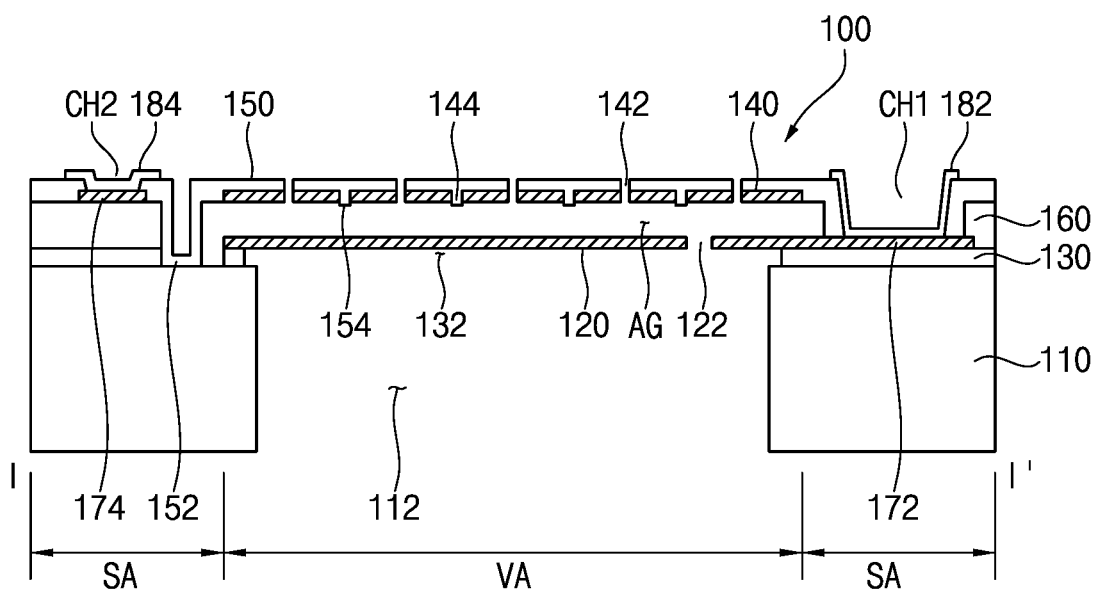
FIG. 2 is a cross sectional view taken along a line I-I' of FIG. 1.

FIG. 1 is a plan view illustrating a MEMS microphone in accordance with an example embodiment of the present invention. FIG. 2 is a cross sectional view taken along a line I-I' in FIG. 1.

Referring to FIGS. 1 and 2, a MEMS microphone 100 in accordance with an example embodiment of the present invention is capable of creating a displacement according to an acoustic pressure to convert sound wave into an electrical signal and output the electrical signal. The MEMS microphone includes a substrate 110, a diaphragm 120, a first insulation layer 130, and a back plate 140.

In particular, the substrate 110 is defined to be divided into a vibration area VA in which a membrane can vibrate in response to sound wave, and a peripheral area SA surrounding the vibration area VA. In the vibration area VA, a cavity 112 is formed.

The diaphragm 120 may be formed over the substrate 110 to cover the cavity 112 and to be exposed through the cavity 112. The diaphragm 120 may be formed to have a membrane structure. The diaphragm 120 may sense an acoustic pressure to create a displacement, and is spaced apart from the substrate in order to be bendable upward or downward in response to the acoustic pressure. In addition, the diaphragm 120 may have an ion implantation region into which impurities are doped, and may have a circular shape as shown in FIG. 1.

The first insulation layer 130 is disposed over the substrate 110 and under the diaphragm 120. The first insulation layer 130 may support the diaphragm 120 while separating the diaphragm 120 from the substrate 110. That is, the first insulation layer 130 may support an end portion of the diaphragm 120 to make the diaphragm 120 to be spaced apart from the substrate 110 such that the diaphragm 120 is separated both electrically and mechanically from the substrate 110 and the diaphragm 120 covers the cavity 112.

Particularly, the first insulation layer 130 has an opening 132 formed by removing a portion of the first insulation layer corresponding to the cavity 112 to partially expose the diaphragm 120 through the cavity 112. The diaphragm 120 is exposed through the opening 132 and the cavity 112, and thus can be bent upward or down sward by the acoustic pressure which is applied to the diaphragm 120.

In an embodiment of the depicted embodiment, e opening 132 may be formed to have an area larger than that of the cavity 112.

As described above, the MEMS microphone 100 according to embodiments of the present invention is configured such that the first insulation layer 130 supports the diaphragm 120 to separate the diaphragm 120 from the substrate 110 without forming a separate anchor. Accordingly, the structure and manufacturing process of the MEMS microphone 100 can be simplified, and process times and manufacturing costs of the MEMS microphone 100 can be reduced.

Meanwhile, the back plate 140 may be disposed over the diaphragm 120. The back plate 140 may be disposed in the vibration area VA and may be disposed to face the diaphragm 120. As shown in FIG. 1, the back plate 140 may be forming in a circular shape. Like the diaphragm 120, impurity doping process may be performed through an ion implantation process to form the back plate 140.

As shown in FIG. 2, the back plate 140 is spaced apart from the diaphragm 120 such that the diaphragm 120 can be bent upward by the acoustic pressure. Accordingly, an air gap AG may be formed between the diaphragm 120 and the back plate 140. Here, the air gap AG may be formed by removing a sacrificial layer positioned between the diaphragm 120 and the back plate 140 such that the diaphragm 120 is spaced apart from the back plate 140.

In an example embodiment of the present invention, the diaphragm 120 may have a plurality of vent holes 122 through which the air gap AG is communicated with the opening 132 of the first insulation layer 130. The vent holes 122 are formed to penetrate through the diaphragm 120 to serve as a path of sound wave and a flow path through which an etching fluid flows for removing a sacrificial layer between the diaphragm 120 and the back plate 140 using the etching fluid. Further, the vent holes 122 may be formed in a region corresponding to the cavity 112 in the diaphragm 120 to communicate with the cavity 112.

The second insulation layer 150 may be disposed over the substrate 110 over which the back plate 140 is formed. The second insulation layer 140 may cover an upper surface of the back plate 140.

The second insulation layer 150 may include a chamber 152 to form the air gap AG. The chamber 152 is formed to be bent toward the substrate 110 outside of the back plate 140, and is disposed in the peripheral area SA. As shown in FIG. 1, the chamber 152 is positioned to be spaced apart from the diaphragm 120, and can be formed in a ring shape to surround the diaphragm 120. As shown in FIG. 2, the chamber 152 can be prepared such that a bottom surface of the chamber 152 contacts the upper surface of the substrate, and the chamber 152 may support the back plate combined with the bottom surface of the second insulation layer 150. Accordingly, the back plate 140 can maintain a state of being separated from the diaphragm 120.

Even though not expressly shown in the figures, those of skill in the art will recognized based upon the Figures and this disclosure that an area in which the air gap AG is formed may be defined by the chamber 152, and that the air gap AG may be formed in a region surrounded by the chamber 152.

Meanwhile, a plurality of acoustic holes 142 through which an acoustic wave passes through may be formed through the back plate 140 and the second insulation layer 150. The acoustic holes 142 are formed to penetrate through the back plate 140 and the second insulation layer 150, and may communicate with the air gap AG.

In addition, the back plate 140 may have a plurality of dimple holes 144, and the second insulation layer 150 may have a plurality of dimples 154 corresponding to the dimple holes 144. The dimple holes 144 are formed to penetrate through the back plate 140, and the dimples 154 are formed in portions in which the dimple holes 144 are formed.

In particular, the dimples 154 may prevent the diaphragm 120 from adhering to the bottom surface of the back plate 140. That is, when sound wave reaches to the diaphragm 120, the diaphragm 120 may be bent upward or downward, and then return to its initial position. In this case, the degree of bending of the diaphragm 120 may vary depending on the strength of the sound wave. The upper surface of the diaphragm 120 may be bent to contact the lower surface of the back plate 140. When the diaphragm 120 is bent so much as to make contact with the back plate 140, the diaphragm 120 may adhere to the back plate 140 not to return from the back plate 140 to the initial position. In order to prevent the above, the dimples 154 protrude toward the diaphragm 120 with respect to the bottom surface of the back plate 140. Also, when the diaphragm 120 is bent so much as to make contact with the back plate 140, the dimples 154 separate the diaphragm 120 from the back plate 140 such that the diaphragm 120 recovers its original position.

Meanwhile, the insulation interlayer 160 may be interposed between the first insulation layer 130 and the second insulation layer 150. The insulation interlayer 160 may be disposed in the peripheral area SA, and may be disposed outside of the chamber 152. The first insulation layer 130 and the insulation interlayer 160 may include silicon oxide.

The diaphragm 120 is connected to the diaphragm pad 172, and the back plate 140 may be connected to the back plate pad 174. The diaphragm pad 172 and the back plate pad 174 may be located in the peripheral area SA. The diaphragm pad 172 is provided on the upper surface of the first insulation layer 150 and is exposed through a first contact hole CH1 formed by partially removing both the second insulating layer 150 and insulation interlayer 160. The back plate pad 174 may be formed on the upper surface of the insulation interlayer 160 and may be exposed through a second contact hole CH2 formed by partially removing the second insulation layer 150.

The first and second pad electrodes 182 and 184 may be formed on the second insulation layer 150. The first pad electrode 182 is located on the upper side of the diaphragm pad 172 and makes contact with the diaphragm pad 172 through the first contact hole CH1. Thus, the first pad electrode 182 may be electrically connected to the diaphragm pad 172. The second pad electrode 184 is positioned on the back plate pad 174 and makes contact with the back plate pad 174 through the second contact hole CH2. Thus, the second pad electrode 184 may be electrically connected to the back plate pad 174. Here, the first and second pad electrodes 182 and 184 may be transparent electrodes.

Hereinafter, the method of manufacturing the MEMS microphone 100 will be described in detail with reference to the drawings.

Figure 3:
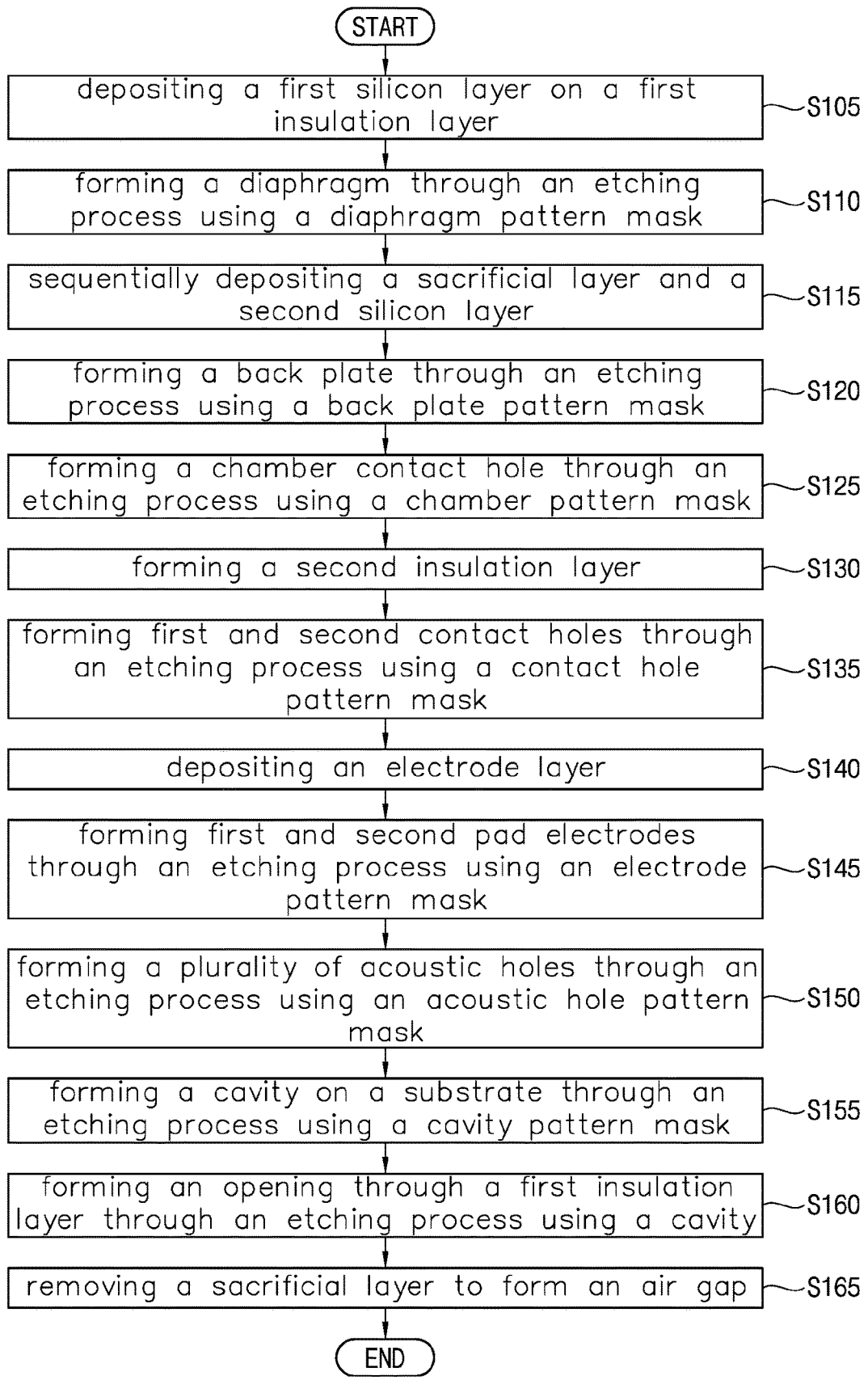
FIG. 3 is a flow chart illustrating a method of manufacturing a MEMS microphone shown in FIG. 1.

FIG. 3 is a flow chart illustrating a method of manufacturing a MEMS microphone shown in FIG. 1. FIGS. 4 to 12 are cross sectional views illustrating a method of manufacturing a MEMS microphone shown in FIG. 2.

Figure 4:
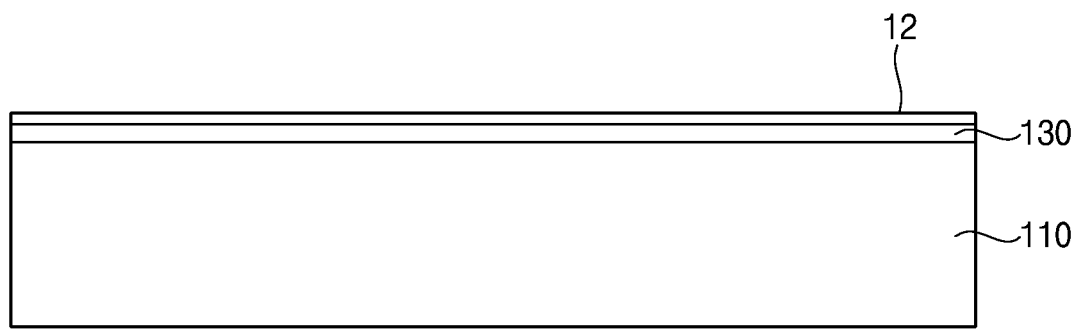
FIGS. 4 to 12 are cross sectional views illustrating a method of manufacturing the MEMS microphone shown in FIGS. 1 and 2.
Figure 5:
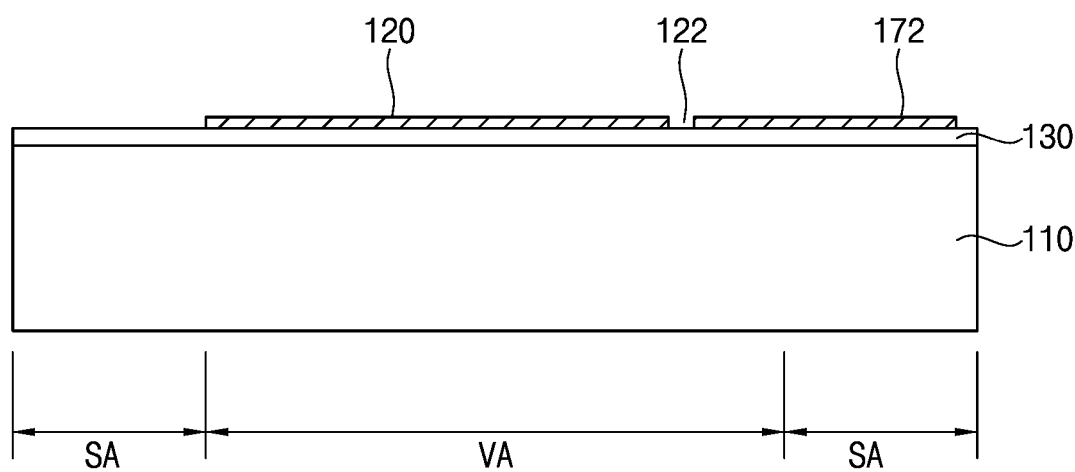

Referring to FIGS. 3 to 5, according to a method for manufacturing the MEMS microphone 101 in accordance with an example embodiment, a first silicon layer 12 is deposited on an upper surface of a first insulation layer 130 formed on a substrate 110, as shown in FIG. 4 (step S105), Here, the first silicon layer 12 may be made of polysilicon.

Next, the first silicon layer 12 is patterned through an etching process using a diaphragm pattern mask to form a diaphragm 120 as shown in FIG. 5 (step S110). Here, a plurality of vent holes 122 may be formed in the diaphragm 120 through the etching process using the diaphragm pattern mask. A diaphragm pad 172 electrically connected to the diaphragm 120 may be formed on the substrate 110 in a peripheral area SA of the substrate 110.

In an embodiment of the present invention, the method of manufacturing a MEMS microphone may further include a step of performing an ion implantation process against the first silicon layer 12, prior to performing the etching process using the diaphragm pattern mask. Particularly, since the MEMS microphone 100 does not have a separate anchor connected with an end portion of the diaphragm 120 for supporting the diaphragm 120 spaced apart from the substrate 110, a separate mask for performing the ion implantation process may not be required. The ion implantation of the diaphragm 120 is possible without using any such separate mask. Accordingly, the method of manufacturing the MEMS microphone according to an embodiment of the present invention can reduce the number of masks, thereby reducing manufacturing costs and time requirements.

Figure 6:
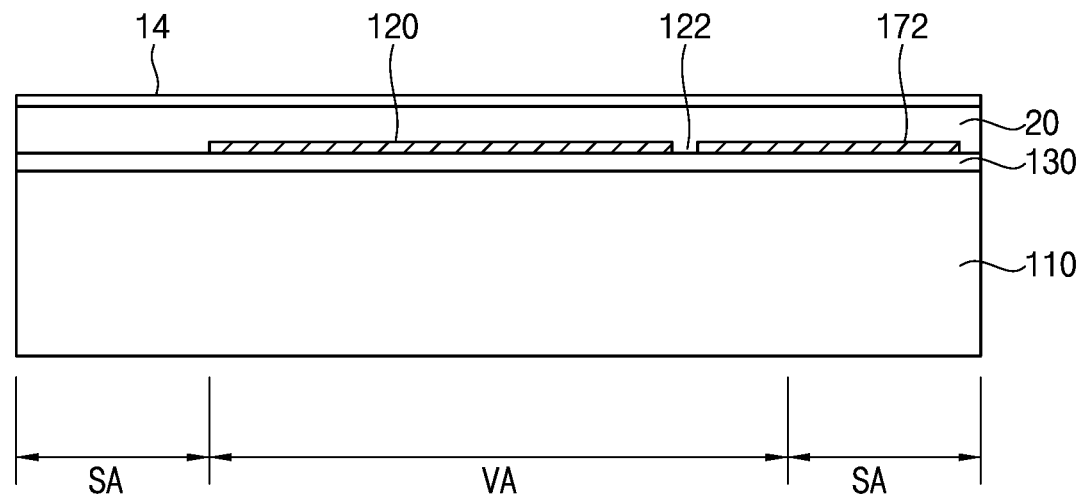
Figure 7:
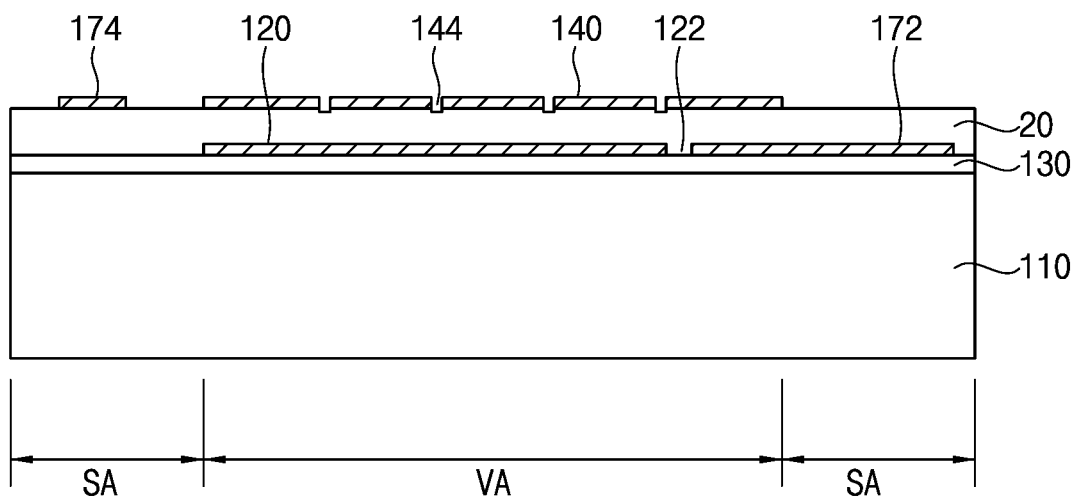

FIGS. 3, 6 and 7, a sacrificial layer 20 and a second silicon layer 14 are sequentially formed on the first insulation layer 130 to cover the diaphragm 120 and the diaphragm pad 172 (Step S115). Here, the second silicon layer 14 may be made of polysilicon. Although specific materials are described with respect to specific embodiments, in alternative embodiments other materials could be used.

Next, the second silicon layer 14 is patterned through an etching process using a back plate pattern mask to form the back plate 140, as shown in FIG. 7 (step S120). Here, dimple holes 144 may be also formed through the back plate 140 by performing the etching process using the back plate pattern mask, and the back plate pad 174 electrically connected to the back plate 140 may be formed in the peripheral region SA. At this time, the sacrificial layer 20, corresponding to the dimple holes 144 may be partially etched so that the dimples 154 (see FIG. 2) may protrude from a bottom surface of the back plate 140.

Figure 8:
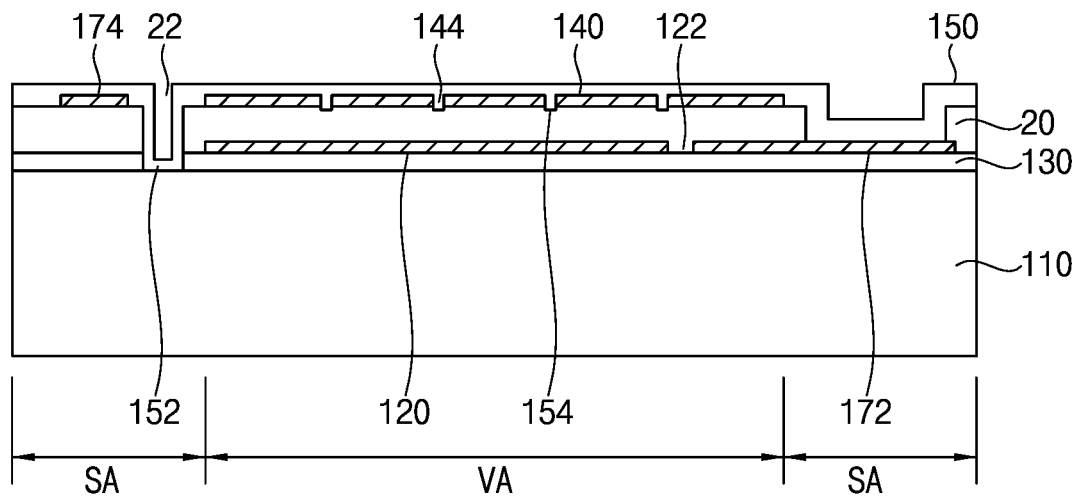
Figure 9:
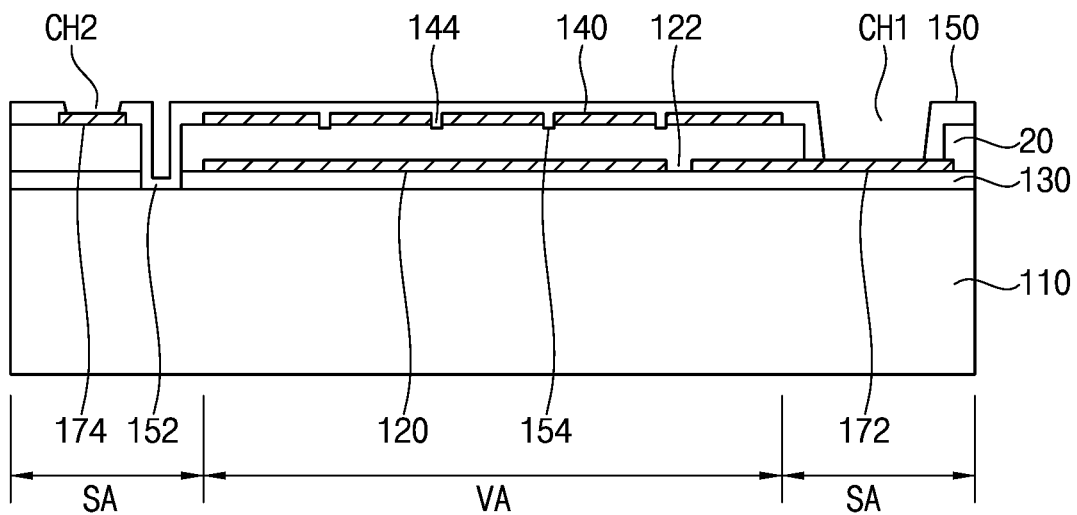

Referring to FIGS. 3, 8 and 9, the sacrificial layer 20 and the first insulation layer 130 are patterned through an etching process using a chamber pattern mask to form the chamber holes 22 in the peripheral area SA as shown in FIG. 8 (Step 125). Here, in order to form the first contact hole CH (shown in FIG. 2), a portion of the sacrificial layer 20 corresponding to the diaphragm pad 172 is removed to partially expose the diaphragm pad 172.

The chamber contact hole 22 is formed to form the chamber 52, and the substrate 110 may be partially exposed through the chamber contact hole 22. Although not shown in figures, the chamber contact hole 22 may be formed to surround the peripheral area SA such that the chamber 152 surrounds the back plate 140.

Then, the second insulation layer 150 is deposited on the sacrificial layer 20 (Step S130). Here, the chamber 152 may be formed in the chamber contact hole 22 and the dimples 154 may be formed in the dimple holes 144.

Then, the second insulation layer 150 is patterned through an etching process using a contact pattern mask to form a first contact hole CH1 for exposing the diaphragm pad 172 and a second contact hole CH2 for exposing the back plate pad 174 (Step S135).

Next, an electrode layer (not shown) is deposited on the second insulation layer 150 through which the first and second contact holes CH1 and CH2 (Step S140).

Figure 10:
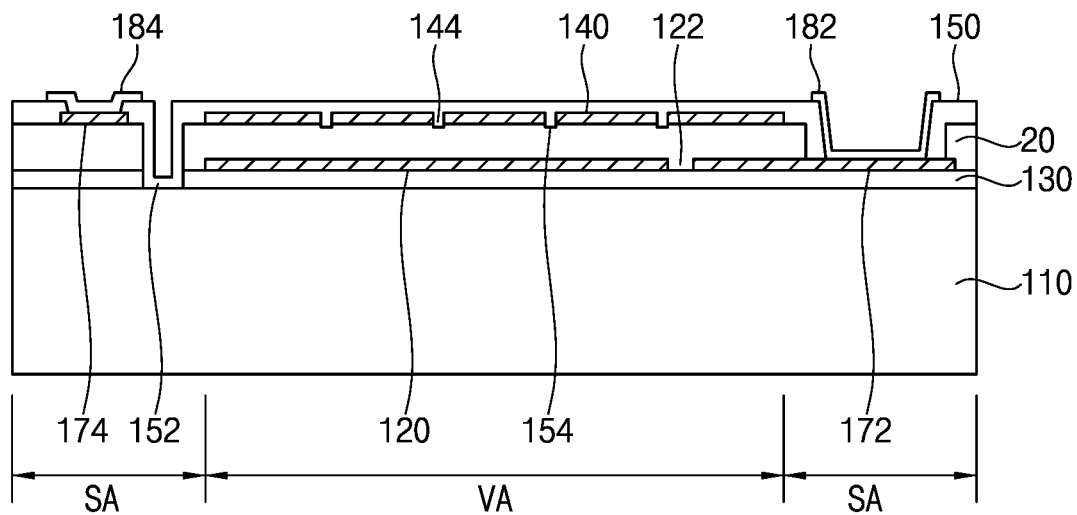

Referring to FIGS. 3 and 10, the electrode layer is patterned through an etching process using an electrode pattern mask to form first and second pad electrodes 182 and 184 (step S145).

Figure 11:
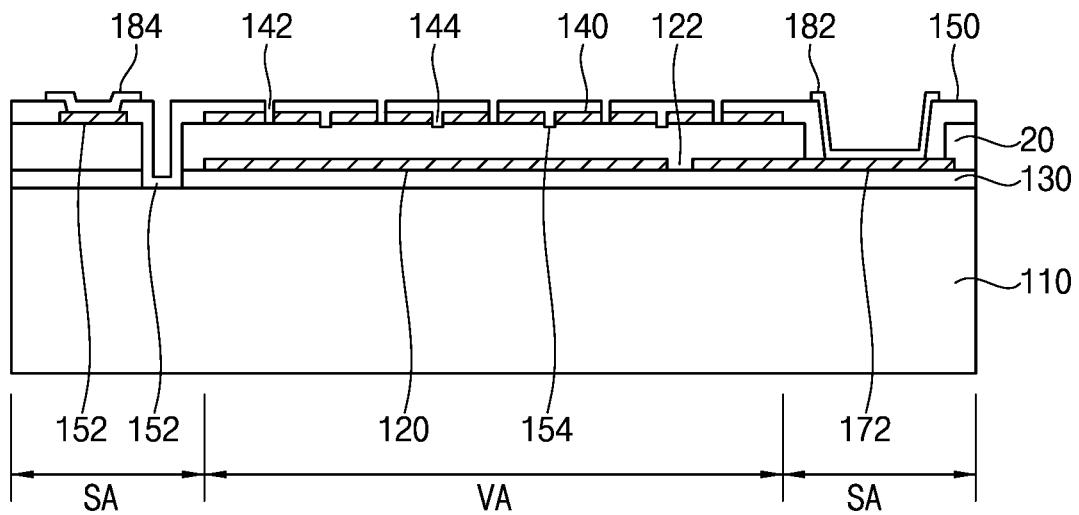

Referring to FIGS. 3 and 11, the second insulation layer 150 and the back plate 140 are patterned through an etching process using an acoustic hole pattern mask to form the acoustic holes 142 (step S150).

Figure 12:
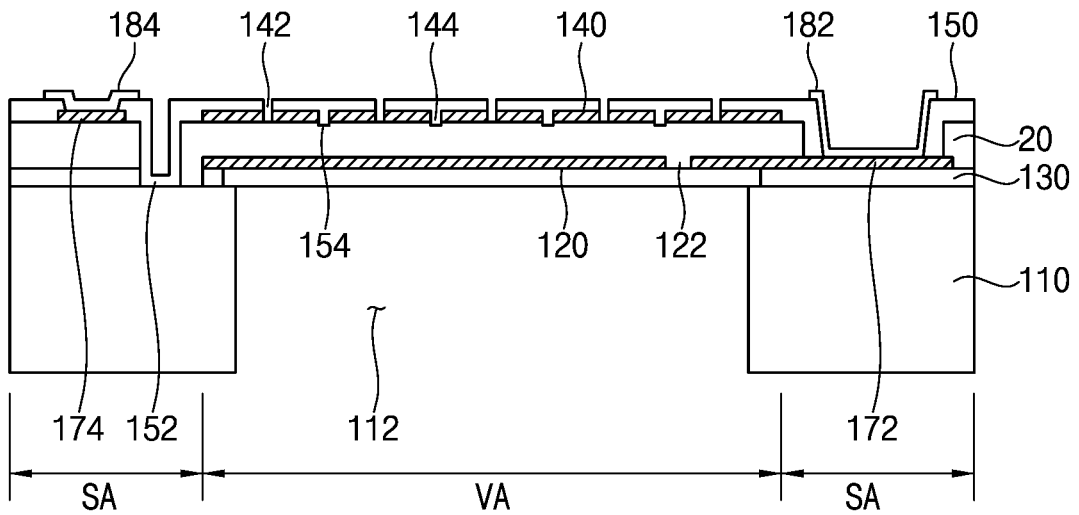

Next, referring to FIGS. 3 and 12, the substrate 110 is patterned through an etching process using a cavity pattern mask to form a cavity 112 in the vibration area VA (step S155).

Referring to FIGS. 2, 3, and 12, a portion of the first insulation layer 130 exposed through the cavity 112 is removed through an etching process using the cavity 112 to form an opening 132 to expose the diaphragm 120 (step S160). At this time, the substrate 110 may be used as an etching mask for patterning the first insulating layer 130, and the opening 132 may be formed to be larger than the cavity 112. Here, hydrogen fluoride (HF) vapor may be used as an etching fluid for forming the opening 132.

Since the end portion of the diaphragm 120 is supported by the first insulation layer 130, the MEMS microphone 100 need not have a separate anchor for supporting the diaphragm 120 from the substrate 110. Accordingly, since the masks for patterning the first insulation layer 130 and for forming the anchor may not be required in the method of manufacturing the MEMS microphone, manufacturing costs can be reduced and process times can be shortened.

Subsequently, the etching fluid is supplied on the substrate 110 to remove a portion of the sacrificial layer 20 located between the diaphragm 120 and the back plate 140, thereby forming the air gap AG (step 165). Thus, the MEMS microphone 100 is completed. At this time, the etching fluid may be also supplied to the sacrificial layer through the acoustic holes 142, and the vent holes 122 may serve as a flow path of the etching fluid. In this case, the chamber 152 defines a portion of the sacrificial layer 20 which is removed by the etching fluid, that is, an area in which the air gap AG is formed, and prevents the etching fluid from flowing toward outside of the chamber 152. Accordingly, the portion of the sacrificial layer 20 disposed outside of the chamber 152 is not removed but remains to form the insulation interlayer 160.

In an embodiment of the present invention, steps S160 and S165 may be simultaneously performed, where the etching fluid is sprayed toward the substrate 110 downward and upward.

As described above, according to example embodiment of the MEMS microphone, since the first insulation layer 130 supports the end portion of the diaphragm 120, an additional element for supporting the diaphragm 120 of the conventional MEMS microphone is not required. Accordingly, since process of forming the anchor for supporting the diaphragm 120 may be omitted, the manufacturing process of MEMS microphones according to embodiments can be simplified, and process times can be shortened. Also, since the mask for forming the anchor and the mask for implanting ions to the diaphragm 120 are not used in the manufacturing processes of the MEMS microphone 100, the number of masks required to manufacture the MEMS microphone 100 compared with a conventional method, and manufacturing costs can be reduced.

In addition, since the dimple holes 144 are formed in the process of forming the back plate 140 using the back plate pattern mask, a separate additional process for forming the dimple holes 144 or a mask for forming the dimple holes 144 is not required. Accordingly, process times can be shortened, and manufacturing costs can be reduced.

Furthermore, before the step S135 of forming of the first and second contact holes CH1 and CH2, the first and second contact holes CH1 and CH2 may be formed together by removing the portion of the sacrificial layer, on which the first contact hole CH1 is formed, in the step S125 of forming the chamber contact hole 162.

Thus, according to the method of manufacturing the MEMS microphone of the present invention, totally six masks can be utilized to manufacture the MEMS microphone 100, which is a reduction compared to the number of masks required in conventional systems and methods. The methods described above therefore result in simplifying the manufacturing process by reducing the number of masks required, shortening the process times, and saving manufacturing costs.

Although the semiconductor gas sensors have been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A MEMS microphone comprising:
   a substrate defining a cavity;
   a back plate disposed over the substrate to cover the cavity and defining a plurality of acoustic holes;
   a diaphragm disposed over the substrate to cover the cavity at a vibration area, the diaphragm being disposed under the back plate, the diaphragm defining at least one venting hole communicating with the cavity and configured to sense an acoustic pressure to create a displacement;
   a first insulation layer interposed between the substrate and the diaphragm to support a peripheral end portion of the diaphragm and to separate the diaphragm from the substrate, the first insulation layer having an opening formed at a position corresponding to the cavity to expose the diaphragm;
   a diaphragm pad formed on an upper surface of the first insulation layer and configured to be connected to the diaphragm;
   an insulation interlayer formed on the first insulation layer on which the diaphragm is formed; and
   a back plate pad formed on an upper surface of the insulation interlayer and configured to be connected to the back plate,
   wherein the peripheral end portion of the diaphragm is entirely and directly connected to an upper surface of the first insulation layer such that the first insulation layer directly supports the diaphragm, and
   wherein both the diaphragm and the diaphragm pad are integrally formed to define a single planar structure.

2. The MEMS microphone of claim 1, wherein the venting hole is formed on portions of the diaphragm corresponding to the cavity.

3. The MEMS microphone of claim 2, wherein the opening has a diameter that is greater than a diameter of the cavity.

4. The MEMS microphone of claim 2, further comprising a second insulating layer formed over the substrate on which the back plate is formed, the second insulating layer covering the back plate, and the second insulation layer including a chamber bent toward the substrate outside of the back plate to separate the back plate from the diaphragm,
and wherein the chamber is mechanically directly coupled to an upper surface of the substrate.

5. The MEMS microphone of claim 4, wherein the back plate has a plurality of dimple holes on a portion corresponding to the cavity,
and the second insulation layer has a plurality of dimples protruding toward the substrate on portions on which the dimple holes are formed,
and the acoustic holes are arranged through both of the second insulation layer and the back plate.

6. The MEMS microphone of claim 5, wherein the dimples protrude under the back plate through the dimple holes.

7. The MEMS microphone of claim 6, wherein the chamber is provided on a portion corresponding to a peripheral portion of the cavity, and surrounds the diaphragm and the back plate.

8. The MEMS microphone of claim 4, further comprising:
a first pad electrode disposed on the second insulation layer and over the diaphragm pad and configured to be electrically connected to the diaphragm pad; and
a second pad electrode disposed on the second insulation layer over the back plate and configured to be electrically connected to the back plate pad,
wherein the insulation interlayer is positioned outside of the chamber under the second insulation layer.

9. A MEMS microphone comprising:
a substrate divided into a vibration area and a peripheral area surrounding the vibration area, the substrate defining a cavity formed in the vibration area;
a first insulation layer disposed on the substrate, and defining an opening corresponding to the cavity;
a back plate disposed over the first insulation layer and in the vibration area, and the back plate defining a plurality of acoustic holes;
a diaphragm on the cavity, the diaphragm being spaced apart from the back plate to be disposed under the back plate, and the diaphragm including a venting hole configured to facilitate fluid communication from an exterior of the MEMS microphone to the cavity, and sensing an acoustic pressure at the exterior that creates a displacement of the diaphragm;
a diaphragm pad formed on an upper surface of the first insulation layer and configured to be connected to the diaphragm;
an insulation interlayer formed on the first insulation layer on which the diaphragm is formed; and
a back plate pad formed on an upper surface of the insulation interlayer and configured to be connected to the back plate,
wherein a peripheral end portion of the diaphragm is entirely and directly connected to an upper surface of the first insulation layer such that the first insulation layer directly supports the diaphragm, and
wherein both the diaphragm and the diaphragm pad are integrally formed to define a single planar structure.

10. The MEMS microphone of claim 9, further comprising a second insulation layer formed on the substrate on which the back plate is formed, to cover the back plate, and the second insulation layer including a chamber bent toward the substrate in the peripheral area to separate the back plate from the diaphragm,
and wherein the chamber makes contact with an upper surface of the substrate.

11. The MEMS microphone of claim 10, wherein the back plate defines a plurality of dimple holes,
and the second insulation layer defines a plurality of dimples protruding toward the substrate through the dimple holes and extending beyond a bottom surface of the back plate,
and the acoustic holes are formed through the second insulation layer and the back plate.

12. The MEMS microphone of claim 11, wherein the chamber surrounds the vibration area.

13. The MEMS microphone of claim 11, further comprising:
a first pad electrode formed on the second insulation layer in the peripheral area, wherein the first pad electrode is electrically connected to the diaphragm pad; and
a second pad electrode formed on the second insulation layer in the peripheral area, wherein the second pad electrode is electrically connected to the back plate pad,
wherein the insulation interlayer is positioned outside of the chamber under the second insulation layer.

14. A method of manufacturing a MEMS microphone comprising:
depositing a first silicon layer on a first insulation layer formed on an upper surface of a substrate;
patterning the first silicon layer to form a diaphragm having a venting hole;
sequentially depositing a sacrificial layer and a second silicon layer on the first insulation layer on which the diaphragm is formed;
patterning the second silicon layer to form a back plate facing the diaphragm, and the back plate having a plurality of acoustic holes;
patterning the substrate to form a cavity partially exposing the first insulation layer under the diaphragm;
removing an exposed portion of the first insulation layer through an etching process using the cavity to form an opening which exposes the diaphragm; and
removing the sacrificial layer located between the diaphragm and the back plate through an etching process using the cavity and the acoustic holes,
wherein forming the diaphragm includes patterning the first silicon layer to integrally form a diaphragm pad connected to the diaphragm, wherein a peripheral end portion of the diaphragm is entirely and directly connected to an upper surface of the first insulation layer such that the first insulation layer directly supports the diaphragm and such that the diaphragm and the diaphragm pad define a combined structure that is planar, and
forming the back plate includes patterning the second silicon layer to form a back plate pad electrically connected to the back plate.

15. The method of claim 14, after forming the back plate, further comprising:
patterning the sacrificial layer and the first insulation layer to form a chamber contact hole for forming a chamber supporting the back plate;
depositing a second insulation layer having the chamber on the sacrificial layer on which the back plate is formed; and patterning the second insulation layer and the back plate to form the acoustic holes penetrating through the second insulation layer and the back plate, and wherein the substrate is partially exposed through the chamber contact hole, and the chamber is formed in the chamber contact hole to make contact with the substrate.

16. The method of claim 15, wherein forming the back plate includes patterning the second silicon layer to form a plurality of dimple holes penetrating through the back plate and removing a portion of the sacrificial layer exposed through the dimple holes, and wherein depositing the second insulation layer includes filling the dimple holes to form a plurality of dimples.

17. The method of claim 16, wherein forming the chamber contact hole includes patterning the sacrificial layer to expose the diaphragm pad and to form an insulation interlayer disposed outside of the chamber contact hole, and wherein after depositing the second insulation layer, further comprising:

patterning the second insulation layer to form a first pad contact hole exposing the diaphragm pad and a second pad contact hole exposing the back plate pad; and forming a first pad electrode and a second pad electrode on the second insulation layer, the first pad electrode making contact with the diaphragm pad through the first pad contact hole, the second pad electrode making contact with the back plate pad through the second pad contact hole.

18. The method of claim 16, wherein the chamber contact hole is formed to surround the diaphragm, and the dimple holes and the acoustic holes are formed on portions of the back plate corresponding to the cavity, and wherein the sacrificial layer is removed by serving the cavity, the opening, the vent hole, and the acoustic holes as flow paths of the etching fluid for removing the sacrificial layer.

19. The method of claim 15, wherein the first insulation layer and the sacrificial layer include the same material, and forming the opening and removing the sacrificial layer are simultaneously performed by an etching process using hydrogen fluoride (HF) vapor as etching fluid.

20. The method of claim 14, wherein:

patterning the first silicon layer comprises an etching process using a diaphragm pattern mask to form the diaphragm having the venting hole;

patterning the second silicon layer comprises an etching process using a back plate pattern mask to form the back plate in the vibration area;

patterning the substrate comprises an etching process using a cavity pattern mask to form the cavity partially exposing the first insulation layer under the diaphragm; and removing an exposed portion of the first insulation layer comprises exposing the first insulation interlayer though the cavity and using an etching process via the cavity to form an opening to expose the diaphragm, and sequentially removing the sacrificial layer in the vibration area using the opening.

21. The method of claim 20, wherein after forming the back plate, the method further comprises:

patterning the sacrificial layer and the first insulation layer through an etching process using a chamber pattern mask to form a chamber contact hole for forming a chamber supporting the back plate in a peripheral area surrounding the vibration area;

depositing a second insulation layer having the chamber on the sacrificial layer on which the back plate is formed; and patterning the second insulation layer and the back plate through an etching process using an acoustic hole pattern mask to form a plurality of acoustic holes penetrating through the back plate and the pad insulation layer, and wherein the chamber is formed in the chamber contact hole to make contact with the substrate, and wherein the venting hole and the acoustic holes serve as flow paths of the etching fluid for removing the sacrificial layer.

22. The method of claim 21, wherein forming the back plate includes forming a plurality of dimple holes penetrating through the back plate through an etching process using the back plate pattern mask and removing a portion of the sacrificial layer exposed through the dimple holes, and wherein depositing the insulation interlayer includes forming a plurality of dimples by filling the dimple holes.

23. The method of claim 22, wherein forming the diaphragm includes patterning the first silicon layer through an etching process using the diaphragm pattern mask to form a diaphragm pad connected to the diaphragm in the peripheral area, and wherein forming the back plate includes patterning the second silicon layer through an etching process using the back plate pattern mask to form a back plate pad connected to the back plate in the peripheral area, and wherein forming the chamber contact hole includes patterning the sacrificial layer through an etching process using the chamber pattern mask to expose the diaphragm pad and to form an insulation interlayer in the peripheral area, and wherein after depositing the second insulation layer further comprises:

patterning the second insulation layer through an etching process using a contact hole pattern mask to form a first pad contact hole exposing the diaphragm pad and a second pad contact hole exposing the back plate pad;

depositing an electrode layer on the second insulation layer on which the first and second pad contact holes are formed; and patterning the electrode layer through an etching process using the electrode pattern mask to form a first pad electrode making contact with the diaphragm pad through the first contact hole and a second pad electrode making contact with the back plate through the second contact hole.

* * * * *